United States Patent
Outka et al.

(10) Patent No.: US 6,770,214 B2
(45) Date of Patent: Aug. 3, 2004

(54) METHOD OF REDUCING ALUMINUM FLUORIDE DEPOSITS IN PLASMA ETCH REACTOR

(75) Inventors: Duane Outka, Fremont, CA (US); Yousun Kim, Santa Clara, CA (US); Anthony Chen, Oakland, CA (US); John Daugherty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 488 days.

(21) Appl. No.: 09/820,691

(22) Filed: Mar. 30, 2001

(65) Prior Publication Data

US 2002/0179569 A1 Dec. 5, 2002

(51) Int. Cl.[7] .................................................. C25F 3/04
(52) U.S. Cl. ............................. 216/67; 216/77; 134/1.1; 134/22.1
(58) Field of Search ............................ 216/13, 37, 67, 216/68, 69, 77, 79; 134/1.1, 22.1; 438/710, 714, 720, 905

(56) References Cited

U.S. PATENT DOCUMENTS

| | | | |
|---|---|---|---|
| 4,657,616 A | 4/1987 | Benzing et al. | |
| 4,786,352 A | 11/1988 | Benzing | |
| 4,816,113 A | 3/1989 | Yamazaki | |
| 4,842,683 A | 6/1989 | Cheng et al. | |
| 4,857,139 A | 8/1989 | Tashiro et al. | |
| 5,006,192 A | 4/1991 | Deguchi | |
| 5,129,958 A | 7/1992 | Nagashima et al. | |
| 5,158,644 A | 10/1992 | Cheung et al. | |
| 5,207,836 A | 5/1993 | Chang | |
| 5,356,478 A | 10/1994 | Chen et al. | |
| 5,468,686 A | 11/1995 | Kawamoto | |
| 5,514,246 A | 5/1996 | Blalock | |
| 5,647,953 A | 7/1997 | Williams et al. | |
| 5,709,757 A | 1/1998 | Hatano et al. | |
| 5,753,137 A | 5/1998 | Ye et al. | |
| 5,756,400 A | 5/1998 | Ye et al. | |
| 5,817,578 A | 10/1998 | Ogawa | |
| 5,926,743 A | 7/1999 | Xi et al. | |
| 5,954,887 A | 9/1999 | Hatano | |
| 6,014,979 A | 1/2000 | Van Autryve et al. | |
| 6,060,397 A | 5/2000 | Seamons et al. | |
| 6,186,153 B1 * | 2/2001 | Kitsunai et al. | 134/1.1 |
| 6,313,048 B1 * | 11/2001 | Hineman et al. | 134/2 |
| 6,383,942 B1 * | 5/2002 | Narita et al. | 438/720 |
| 6,420,274 B1 * | 7/2002 | Baker et al. | 438/706 |

FOREIGN PATENT DOCUMENTS

| | | |
|---|---|---|
| JP | 57-201016 | 12/1982 |
| JP | 61-250185 | 11/1986 |
| JP | 62-214175 | 9/1987 |
| JP | 63-267430 | 11/1988 |
| JP | 3-62520 | 3/1991 |

* cited by examiner

Primary Examiner—Allan Olsen
(74) Attorney, Agent, or Firm—Burns, Doane, Swecker & Mathis, LLP (57) ABSTRACT

A method of reducing aluminum fluoride deposits in a plasma etch reactor. The deposits can be reduced during a cleaning step wherein the cleaning gas includes $BCl_3$ energized into a plasma such that dissociated and undissociated $BCl_3$ are formed and the undissociated $BCl_3$ reacts with aluminum fluoride deposits and forms volatile products which are removed from the chamber. The introduction of $Cl_2$ into the cleaning gas allows control of the degree of $BCl_3$ dissociation. The deposits can also be reduced during etching of an aluminum layer by controlling the amount of fluorocarbon used in the main etch and adding $BCl_3$ during the overetch. The cleaning step may be performed without a substrate in the chamber and may be followed by a conditioning step.

20 Claims, 9 Drawing Sheets

METHOD OF REDUCING ALUMINUM FLUORIDE DEPOSITS IN PLASMA ETCH REACTOR

FIELD OF THE INVENTION

The invention relates to techniques for reducing deposits in plasma etch reactors.

BACKGROUND OF THE INVENTION

Current semiconductor processing equipment, including plasma reactors (both etch and chemical vapor deposition (CVD) type), create non-volatile byproducts that deposit on the chamber walls. These byproducts change the chemical composition of the chamber wall. Build-up of these deposits can cause process drift, particle contamination, and a short chamber maintenance cycle because of the necessity for frequent wet cleans.

During processing of semiconductor wafers it is conventional to carry out periodic in-situ cleaning of plasma etch and CVD reactors to alleviate the above mentioned problems. U.S. Pat. No. 5,129,958 discloses a method for cleaning a CVD deposition chamber in a semiconductor wafer processing apparatus wherein fluorine residues in the chamber, left from a prior fluorine plasma cleaning step, are contacted with one or more reducing gases such as silane ($SiH_4$), ammonia, hydrogen, phosphine ($PH_3$), diborine ($B_2H_6$), and arsine ($AsH_3$). Another technique for cleaning and conditioning interior surfaces of plasma CVD reactors is disclosed in commonly owned U.S. Pat. No. 5,647,953, the subject matter of which is hereby incorporated by reference. In the past these cleans were done with a wafer in the chamber to cover the electrode, but it has become more common to do waferless cleans.

Other techniques for cleaning plasma reaction chambers are disclosed in U.S. Pat. Nos. 4,657,616; 4,786,352; 4,816,113; 4,842,683, 4,857,139; 5,006,192; 5,129,958; 5,158,644 and 5,207,836 and in Japanese Laid-Open Patent Publication Nos. 57-201016; 61-250185, 62-214175, 63-267430 and 3-62520, and in commonly owned U.S. Pat. No. 5,356,478. For instance, in order to remove $SiO_X$ deposits, a fluorine-containing gas energized into a plasma has been used to clean interior surfaces of the chamber. Fluorine residues remaining after the reactor cleaning can be removed by passing a reducing gas such as hydrogen ($H_2$), silane ($SiH_4$), ammonia ($NH_4$), phosphine ($PH_3$), biborine ($B_2H_6$) or arsine ($AsH_3$) through the reactor.

In process chambers that etch aluminum metal, some of the byproduct can be composed of aluminum fluoride or other solid material consisting in part of aluminum and fluorine atoms. While an aluminum etch chamber requiring an etch process that uses a fluorine-containing gas (e.g., $CF_4$, $CHF_3$) is one example of a source that may produce aluminum fluoride, other processes can as well. Since many processing chambers are constructed of aluminum metal, almost any process that uses a fluorine-containing gas can produce aluminum fluoride. A process to eliminate aluminum fluoride from the chamber would reduce the incidence of defects, chamber processing drift, and/or chamber downtime for cleaning and maintenance.

SUMMARY OF THE INVENTION

This invention provides a method of cleaning a plasma etch chamber in which substrates are processed, comprising the steps of introducing a cleaning gas comprising a chlorine-containing gas into the chamber, energizing the cleaning gas into a plasma state, forming dissociated and undissociated reactive species in the chamber and reacting these species with deposits on the interior surfaces of the chamber. After the cleaning step, a conditioning step may be performed.

In a first preferred embodiment, a method of cleaning aluminum fluoride deposits from a plasma reaction chamber after etching a semiconductor substrate is provided. A cleaning gas comprising at least $BCl_3$ is supplied to a plasma etch reactor. When energized into a plasma state, the cleaning gas forms dissociated and undissociated $BCl_3$ and the undissociated $BCl_3$ reacts with aluminum fluoride deposits in the plasma etch reactor and cleans the deposits from the interior surfaces. The cleaning gas may comprise $BCl_3/O_2$ or $BCl_3+Cl_2/O_2$ wherein a concentration of $Cl_2$ may be supplied to obtain a desired degree of $BCl_3$ dissociation.

In a second preferred embodiment, a method of reducing aluminum fluoride deposits from a plasma reaction chamber during plasma etching of a semiconductor substrate is provided. The etching step includes a main etch and an overetch. An etching gas during the main etch includes $C_xF_yH_z$ wherein $x \geq 1$, $y \geq 1$ and $z \geq 0$ and aluminum fluoride deposits are formed during the main etch. The etching gas during the overetch includes at least $BCl_3$ which is energized into a plasma state and forms dissociated and undissociated $BCl_3$. During the over etch, the undissociated $BCl_3$ reduces the aluminum fluoride deposits in the plasma etch reactor. Subsequent to the etching step, the substrate can be removed from the plasma etch reactor and a cleaning step can be carried out. The cleaning gas may comprise $O_2$, $Cl_2/O_2$, $BCl_3/O_2$ or $BCl_3+Cl_2/O_2$ wherein a concentration of $Cl_2$, may be supplied to obtain a desired degree of $BCl_3$ dissociation.

It is further provided that the method may include a plasma etching step in which a main etching gas comprising $C_xF_yH_z$ wherein $x \geq 1$, $y \geq 1$, and $z \geq 0$, $Cl_2$, $N_2$ and $BCl_3$ and an over etching gas comprising $Cl_2$ and $BCl_3$ is utilized to etch a semiconductor wafer.

DETAILED DESCRIPTION OF THE INVENTION

The invention provides an economical and efficient method of reducing deposits in a plasma etch reactor in which substrates are processed. The method includes supplying an etching gas to the plasma etch reactor and reducing deposits in the plasma etch chamber by energizing the etching gas into a plasma state such that a portion of the etching gas dissociates and the undissociated gas reacts with the deposits in the plasma etch reactor.

In a first preferred embodiment, the invention provides a method of cleaning a plasma etch reactor by removing aluminum fluoride deposits. A cleaning gas with at least $BCl_3$ is supplied to the plasma etch reactor. Upon energizing into a plasma state, at least a portion of the $BCl_3$ gas is dissociated and the undissociated $BCl_3$ reacts with aluminum fluoride deposits. The process may be accomplished in a waterless autoclean (WAC).

In a second preferred embodiment, fluoride deposits are reduced during plasma etching of a semiconductor substrate. The etching step includes a main etch and an overetch. An etching gas during the main etch includes $C_xF_yH_z$ wherein $x \geq 1$, $y \geq 1$ and $z \geq 0$ and aluminum fluoride deposits are formed during the main etch. The etching gas during the overetch includes at least $BCl_3$ which is energized into a plasma state and forms dissociated and undissociated $BCl_3$. During the over etch, the undissociated $BCl_3$ reduces the aluminum fluoride deposits in the plasma etch reactor. Subsequent to the etching step, the substrate can be removed from the plasma etch reactor and a cleaning step can be carried out. The cleaning gas may comprise $O_2$, $Cl_2/O_2$, $BCl_3/O_2$ or $BCl_3+Cl_2/O_2$ wherein a concentration of $Cl_2$ may be supplied to obtain a desired degree of $BCl_3$ dissociation.

Additionally, the methods of the invention may be conducted in any suitable plasma etch reactor. For example, the plasma etch reactor may be an ECR plasma reactor, an inductively coupled plasma reactor, a capacitively coupled plasma reactor, a helicon plasma reactor or a magnetron plasma reactor. A more specific example of a plasma etch reactor suitable for practicing the invention includes an inductively coupled plasma reactor having an antenna which inductively couples radio frequency energy into an interior of the plasma etch reactor through a dielectric member. The plasma etch reactor preferably includes a bottom electrode in the interior on which a semiconductor substrate can be supported. During the cleaning step, the antenna may be powered with 100 to 3000 watts and the bottom electrode can be powered with up to 3000 watts.

In an additional preferred embodiment, the invention provides a waterless plasma process for cleaning chambers used for plasma etching an aluminum (Al) containing film stack. The process for plasma etching of Al produces a by-product which deposits throughout the reactor. Eventually this by-product reaches a thickness where it no longer sticks to the reactor wall and particles are shed which contaminate the substrate being etched. When this happens, the reactor must be opened and cleaned with a wet clean process.

For example, a WAC may be utilized in etch chambers to increase the mean time between cleaning (MTBC) and to reduce the possible process shifts contributed by chamber deposits. The process of preparing a reactor for cleaning, along with the actual clean process and the steps required to condition the chamber following an open chamber clean can require a substantial amount of time. To maximize productivity in a wafer fab, it is desirable to extend the time between opening the chamber to do such open chamber cleans. One method for doing this has been to run plasma cleans, which are capable of reducing the etch by-product deposited in the chamber resulting in a extended time between open chamber cleans. However, since plasma cleans alter the chamber condition by removing the reactor deposits, there is typically a process shift following the plasma clean. As a result, the aluminum etch rate, etch profiles, and feature CDs (critical dimension) can shift outside of the acceptable range for the device being manufactured. If a plasma clean is used, wafers may be cycled through the chamber to recondition the walls prior to etching product wafers. An example of a conditioning process is disclosed in commonly owned U.S. patent application Ser. No. 09/469,286, the subject matter of which is hereby incorporated by reference.

In processes wherein a wafer is needed in the chamber for conditioning, a special wafer type may also be needed. This limits the applicability of plasma clean processes for Al etching in a production environment because it would be disruptive to production flows to have to load special wafers into the chamber and run a conditioning process after a plasma clean. As a result, in production, plasma cleans would not be used and the reactors would need to be opened more frequently for long wet clean procedures. Thus, the reactor availability advantage of using plasma cleans to extend the wet clean time is negated by the burden of reconditioning the chamber with a special wafer type.

The invention provides a process that can be run without a wafer in the chamber to clean by-products of the Al etch from the surfaces of the etch reactor. One of the commonly used additive gases for Al etch is $CHF_3$ which yields $AlF_3$ in the chamber deposits. Alternative main etching gases may include $C_xF_yH_z$ wherein $x \geq 1$, $y \geq 1$, and $z \geq 0$, $Cl_2$, $N_2$, and $BCl_3$. $C_xF_yH_z$ may be in the form $CF_4$, $CHF_3$ or mixtures thereof.

Previously, metal etch chambers were not candidates for WAC due to the type of deposits resulting from the Al etch. For example, $AlF_3$ may form as a byproduct of $CHF_3$ used during the etching process. $AlF_3$ is a highly stable, non-reactive, and non-volatile material that is thermodynamically unfavorable to remove. The success of WAC for metal etch seemed improbable because it was thought that removal of $AlF_3$ with WAC would be unfeasible. However, according to the invention, deposits formed during Al etch can be removed using $BCl_3$ as a cleaning gas in a WAC process.

A wet clean of an aluminum etch chamber was performed followed by an evaluation of the cleaning process. A Lam TCP™ 9600PTX™ etcher was used for testing cleaning processes with and without WAC. In addition to not having a chamber liner, the test chamber had special test hardware installed at locations of a vertically movable "uniformity ring" (U-ring) surrounding the wafer, the gas distribution oplate (GDP) and at the chamber wall.

Figure 1:
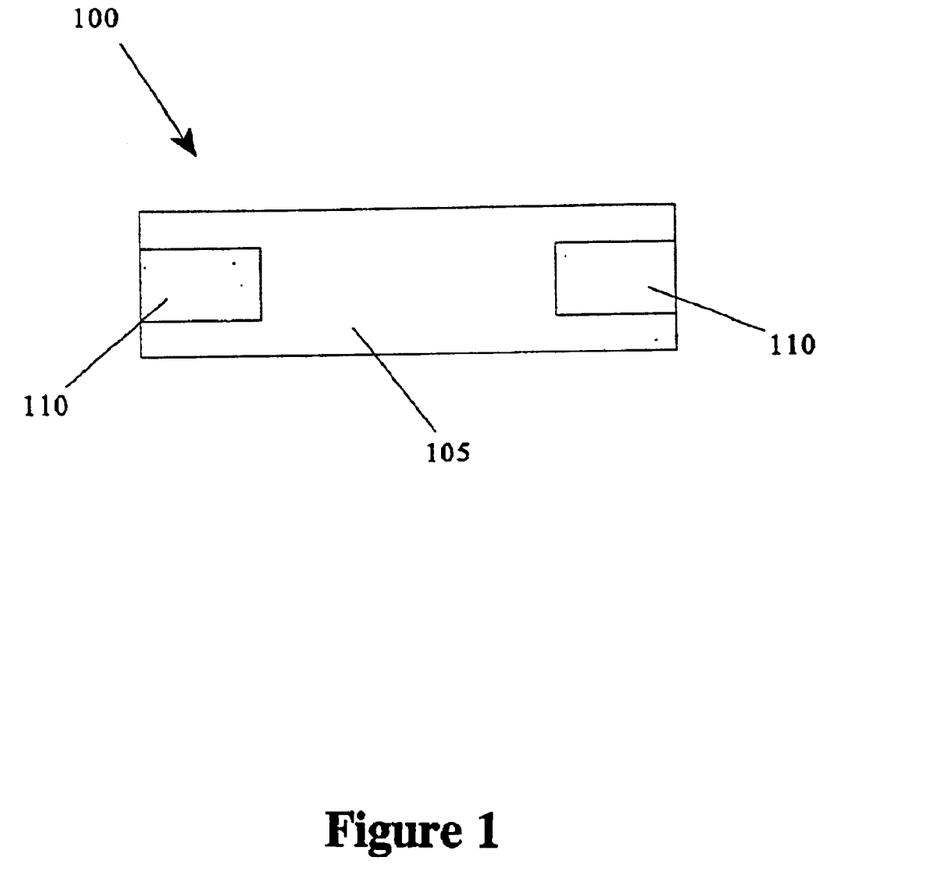
FIG. 1 is a schematic of a test piece.

FIG. 1 shows a test piece 100 used throughout the evaluation. A representative test piece 100 may be cleaved from $SiO_2$ wafers to form coupons 105. A mask 110 may be placed on the coupon 105 to allow height differentiation after exposing the test piece 100 to in-chamber deposits. After the chamber and its parts were cleaned, three test pieces 100 were attached with non-thermoplastic polyimide tape. A representative polymeric (e.g. non-thermoplastic polyimide-based) composition which is suitable for this purpose is a commercial product sold under the trademark "KAPTON" by E. I. DuPont de Nemours and Company of Wilmington, Del. (USA). The test pieces 100 were positioned at predetermined locations (the transfer module side of the U-ring, the gas distribution plate (GDP), and the chamber wall on the side of the transfer module).

After securing the test pieces 100, the chamber was pumped down and 25–50 etch cycles were conducted with appropriate Open Area wafers and recipes. Note that there is no conditioning of the chamber. After the wafers are cycled, the chamber was pump purged. After the chamber had been sufficiently pump purged, the chamber was opened and the test pieces 100 collected. Upon extraction, the masks 110 were taken off and the step height difference between the masked area and the exposed area where the byproducts were deposited was measured six times (three measurements each side) with a KLA-Tencor P-2 Long Scan Profiler. An average of these six measurements was calculated and designated as the deposit thickness for the location of the test piece 100. The masks 110 were carefully removed so as not to disturb the exposed area and the thickness was measured immediately after extraction from the chamber to minimize the effect of humidity on the deposits, which might otherwise flake off or change. Deposit elemental composition data was collected with a Hitachi 4100 EDS SEM. $SiO_2$ was factored out of the composition and the thickness analysis because the test pieces are also made of $SiO_2$.

In the evaluation, 50% and 100% Open Area wafers were used as etch substrates. All 100% Open Area wafers had Al thickness of 10,000 Å. 50% Open Area wafers had two Al thicknesses: 10,000 Å and 5,000 Å. The 10,000 Å wafers were used to reproduce chamber conditions during metal etch where the wafers were etched only partway into the Al. The 5,000 Å wafers were used to replicate chamber conditions during metal etch and overetch steps and were etched all the way through the Al and into the oxide layer.

Process recipes used to determine dependence of thickness and composition of chamber deposits on the percent Open Area of a wafer and $CHF_3$ flow with and without WAC are listed in Tables 1 and 2:

TABLE 1

Recipes Used for $CHF_3$ Additive Chemistry Coupon Study

| Type of Etch | | Etch Recipe |
|---|---|---|
| Main Etch Recipe | 1) | 12 mT/800 $W_{TCP}$/130 $W_b$/120 $Cl_2$/70 $BCl_3$/$X^a$ $CHF_3$/60 seconds |
| Base WAC Recipe | 1) | 30 mT/800 $W_{TCP}$/100 $W_b$/200 $O_2$/3 seconds |
| | 2) | 30 mT/800 $W_{TCP}$/4 $W_b$/200 $O_2$/12 seconds |
| | 3) | 30 mT/800 $W_{TCP}$/4 $W_b$/160 $Cl_2$/10 seconds |

[a]X determined from Table 2; Bottom Electrode Temperature = 50° C.; Chamber Temperature = 70° C.

TABLE 2

Matrix for % Wafer Open Area and $CHF_3$ Flow

| Open Area | $CHF_3$ (sccm) | WAC |
|---|---|---|
| 100% | 5 | With and Without |
| 50% | 5, 10, 16 | With and Without |

$CHF_3$ Additive Metal Etch Without WAC

Figure 2:
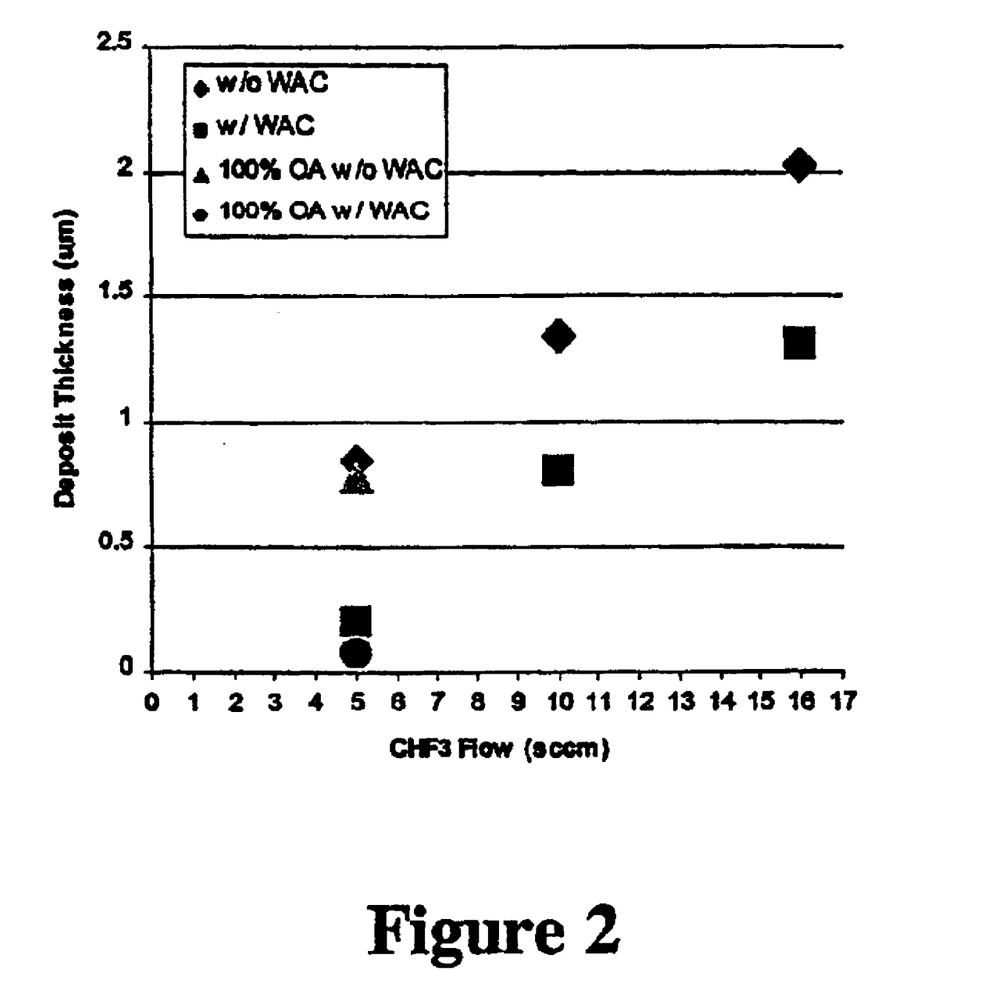
FIG. 2 shows the relationship between deposition thickness and $CHF_3$ gas flow rate.

The effect of the amount of $CHF_3$ on chamber deposits during metal etch was evaluated. FIG. 2 shows deposit thickness as a function of $CHF_3$ flow rate. Here, the deposit thickness is the average of the thickness at the three locations. From FIG. 2, a linear relationship between $CHF_3$ flow and deposit thickness is observed. Deposit thickness increases with increasing $CHF_3$ flow, which indicates that $CHF_3$ is a source for chamber deposit. Thus, the chamber deposit thickness, and possibly even MTBC, may be controlled and manipulated by the flow of $CHF_3$.

Figure 3A:
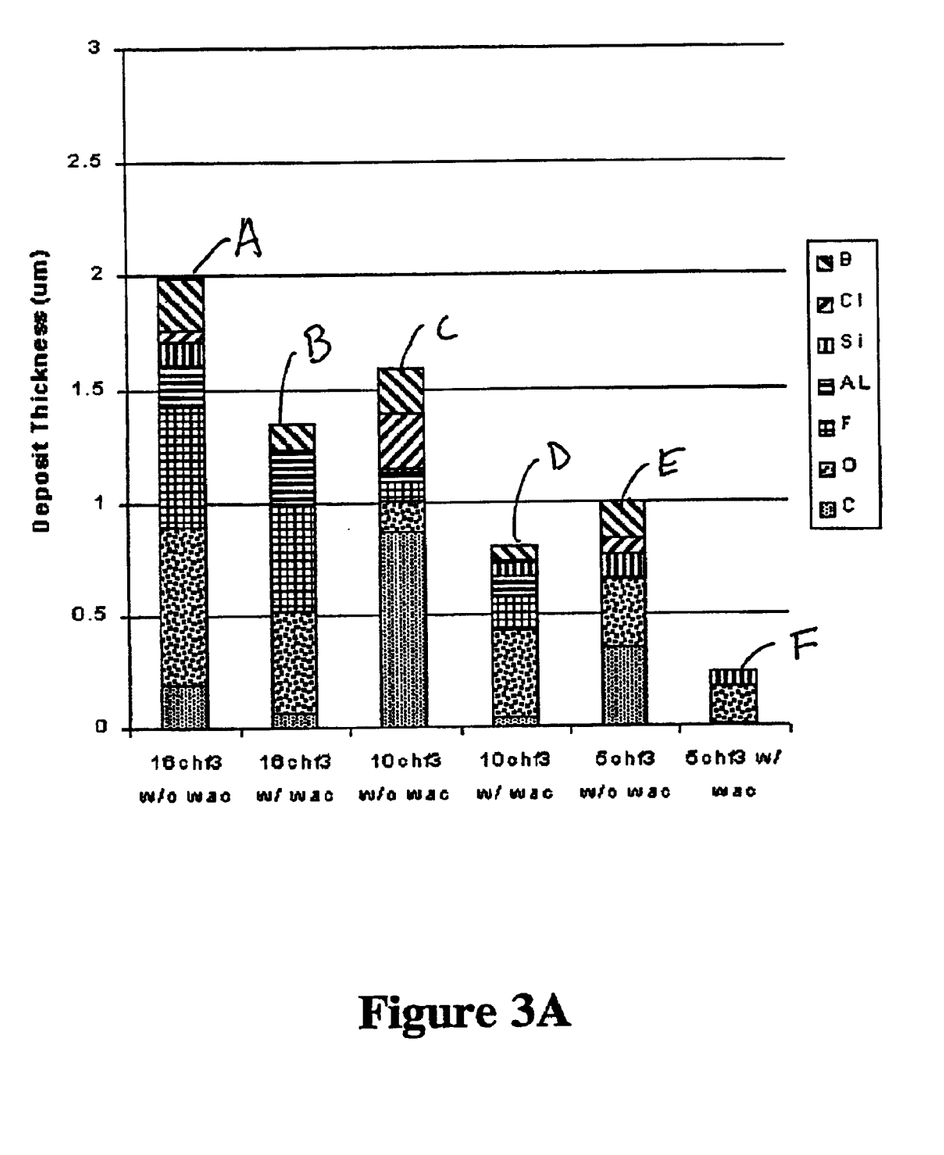
FIGS. 3A–C show the thickness of the chamber deposits at three sample locations in the chamber.
Figure 3B:
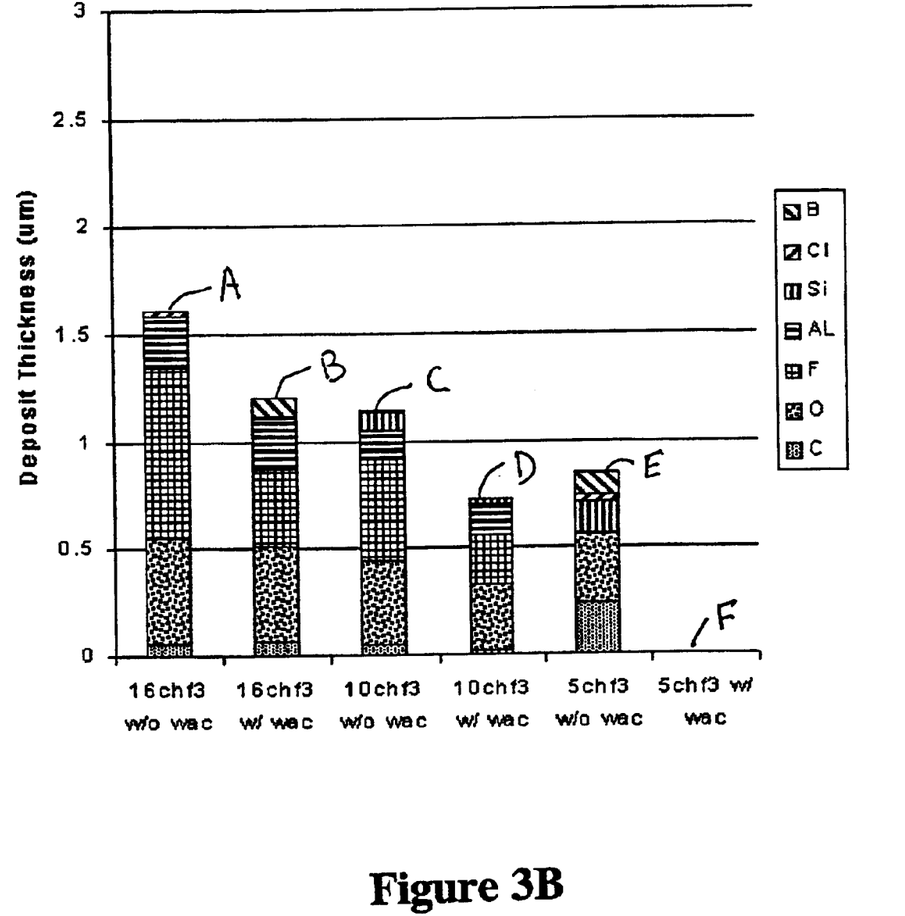
Figure 3C:
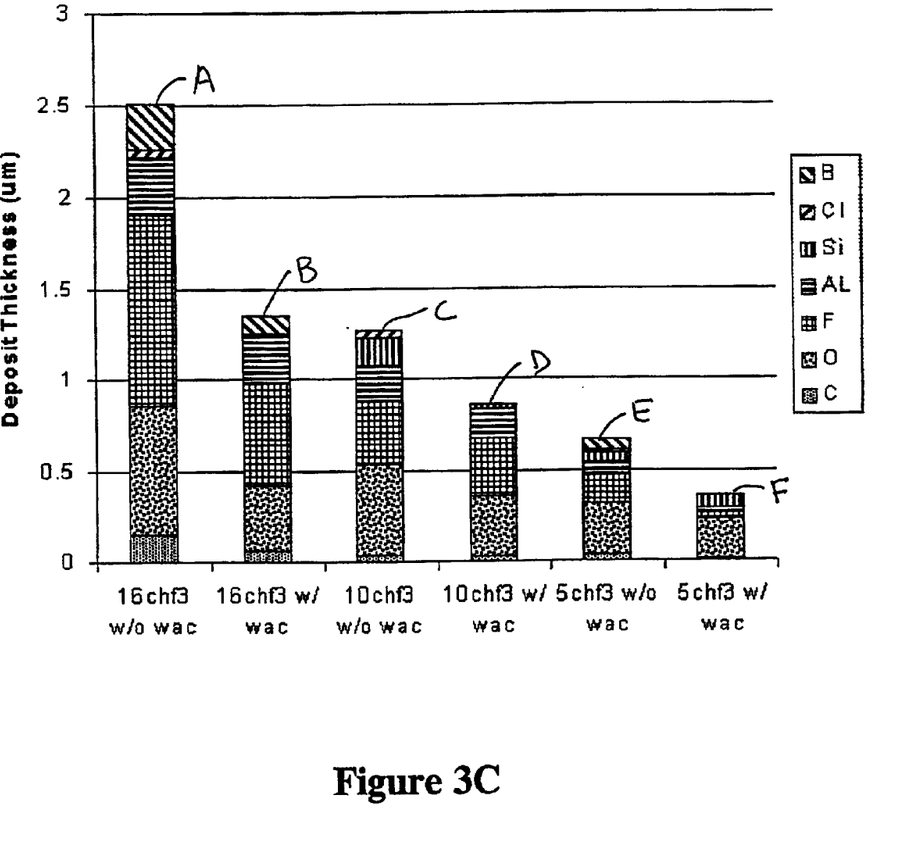

FIGS. 3A–C show deposit thickness at three locations for different $CHF_3$ flow rates with and without WAC using the base WAC recipe. The composition of the deposit is dependent on $CHF_3$ flow and there is a considerable difference in concentration of Al and F between different $CHF_3$ flows. Large amounts of Al and F are present in the deposits with 16 sccm $CHF_3$. In contrast, only a trace amount of Al and F was observed in the deposits with 5 sccm $CHF_3$.

At the location of the U-ring, column A of FIG. 3A indicates that the deposit thickness was about 2 µm after the etch step using 16 sccm $CHF_3$ and column B indicates that the deposit thickness was reduced to about 1.4 µm after the WAC wherein $O_2$ gas was used as the cleaning gas. Measurements of B, Cl, Si, Al, F, O and C contents of the deposits indicate that about one-third of the deposit after the etch step and after the cleaning step was comprised of Al and F and that at least some of the Al and F is in the form of aluminum fluoride. Column C indicates that the deposit thickness was about 1.6 µm after the etch step using 10 sccm $CHF_3$ and column D indicates that the deposit thickness was reduced to about 0.8 µm after the WAC wherein $O_2$ gas was used as the cleaning gas. Measurements of B, Cl, Si, Al, F, O and C contents of the deposits indicate very little of the deposit after the etch step and after the cleaning step was comprised of Al and F. Column E indicates that the deposit thickness was about 1 µm after the etch step using 5 sccm $CHF_3$ and column F indicates that the deposit thickness was reduced to about 0.25 µm after the WAC wherein $O_2$ gas was used as the cleaning gas. Measurements of B, Cl, Si, Al, F, O and C contents of the deposits indicate no detectable amount of the deposit after the etch step and after the cleaning step was comprised of Al and F.

At the location of the GDP, column A of FIG. 3B indicates that the deposit thickness was about 1.6 µm after the etch step using 16 sccm $CHF_3$ and column B indicates that the deposit thickness was reduced to about 1.25 µm after the WAC wherein $O_2$ gas was used as the cleaning gas. Measurements of B, Cl, Si, Al, F, O and C contents of the deposits indicate that about two-thirds of the deposit after the etch step and after the cleaning step was comprised of Al and F and that at least some of the Al and F is in the form of aluminum fluoride. Column C indicates that the deposit thickness was about 1.25 µm after the etch step using 10 sccm $CHF_3$ and column D indicates that the deposit thickness was reduced to about 0.75 µm after the WAC wherein $O_2$ gas was used as the cleaning gas. Measurements of B, Cl, Si, Al, F, O and C contents of the deposits indicate that about 50 to 60% of the deposit after the etch step and after the cleaning step was comprised of Al and F. Column E indicates that the deposit thickness was about 0.85 µm after the etch step using 5 sccm $CHF_3$ and column F indicates that the deposit was removed after the WAC wherein $O_2$ gas was used as the cleaning gas. Measurements of B, Cl, Si, Al, F, O and C contents of the deposits indicate no detectable amount of the deposit after the etch step and after the cleaning step was comprised of Al and F.

At the position of the chamber wall, column A of FIG. 3C indicates that the deposit thickness was about 2.5 µm after the etch step using 16 sccm $CHF_3$ and column B indicates that the deposit thickness was reduced to about 1.4 µm after the WAC wherein $O_2$ gas was used as the cleaning gas. Measurements of B, Cl, Si, Al, F, O and C contents of the deposits indicate that about 50% of the deposit after the etch step and after the cleaning step was comprised of Al and F and that at least some of the Al and F is in the form of aluminum fluoride. Column C indicates that the deposit thickness was about 1.3 µm after the etch step using 10 sccm $CHF_3$ and column D indicates that the deposit thickness was reduced to about 0.8 µm after the WAC wherein $O_2$ gas was used as the cleaning gas. Measurements of B, Cl, Si, Al, F, O and C contents of the deposits indicate that about 50% of the deposit after the etch step and after the cleaning step was comprised of Al and F. Column E indicates that the deposit thickness was about 0.7 μm after the etch step using 5 sccm $CHF_3$ and column F indicates that the deposit thickness was reduced to about 0.35 μm after the WAC wherein $O_2$ gas was used as the cleaning gas. Measurements of B, Cl, Si, Al, F, O and C contents of the deposits indicate that about 30% of the deposit after the etch step was comprised of Al and F and that Al and F were not detected in the deposit after the WAC.

FIG. 2 also depicts the influence of wafer Open Area on deposit thickness with and without WAC with a 5 sccm $CHF_3$ additive metal etch. Effects of different Open Areas on chamber deposits was evaluated since, in addition to other Al containing parts, Al of the $AlF_3$ can originate from the wafer surface. Most metal product wafers currently have 30–40% Open Area. However, with decreasing critical dimension and geometry, the Open Area is expected to increase. FIG. 2 reveals that the deposit thickness did not significantly vary between 50% Open Area wafers and 100% Open Area wafers at a $CHF_3$ flow rate of 5 sccm.

$CHF_3$ Additive Metal Etch With WAC

FIG. 2 reveals that the WAC may decrease the deposit thickness and that the efficiency of the WAC may be limited by the $CHF_3$ flow. $CHF_3$ flow may not only influence the deposit thickness; it may also have a significant effect on the composition of the deposit. The amount of Al and F in the deposit is affected by the amount of $CHF_3$ present during metal etch. FIGS. 3A–C reveal that as $CHF_3$ flow rate increases the Al and F in the deposit also increases. Although, a small flow rate of $CHF_3$ ($\leq 5$ sccm) may reduce or eliminate $AlF_3$ in the deposit, possibly due to the limited Al and F deposits at this low flow rate, the current WAC may be insufficient for eliminating deposits formed when using $\geq 5$ sccm $CHF_3$ during the Al etch. Therefore, it may be concluded that the efficiency of the current WAC is limited by the amount of $CHF_3$ present during metal etch.

Effects of Over Etch Step With $CHF_3$ Additive Metal Etch

An Over Etch (OE) step after the Main Etch (ME) may affect the composition of the chamber deposits. Table 3 shows the recipes used to study the effects of the OE step. The ME may include $C_xF_yH_z$ as a component wherein $x \geq 1$, $y \geq 1$, and $z \geq 0$. An example of representative gas is $CHF_3$. The OE may be carried out with a $C_xF_yH_z$-free gas, e.g., $BCl_3$ and/or $Cl_2$ as components. The wafers used were 50% Open Area Aluminum wafers (10,000 Å Al).

TABLE 3

Recipes Used to Study the Effects of the Over Etch Step

| Type of Etch | | Etch Recipe |
|---|---|---|
| ME: Main Etch Recipe | 1) | 12 mT/800 $W_{TCP}$/130 $W_b$/120 $Cl_2$/ 70 $BCl_3$/10 $CHF_3$ /EndPt (40~45 seconds) |
| OE: Over Etch Recipe | 1) | 12 mT/700 $W_{TCP}$/120 $W_b$/50 $Cl_2$/50 $BCl_3$/ 40 seconds |
| WAC Recipe | 1) | 30 mT/800 $W_{TCP}$/100 $W_b$/200 $O_2$/3 seconds |
| | 2) | 30 mT/800 $W_{TCP}$/4 $W_b$/200 $O_2$/12 seconds |
| | 3) | 30 mT/800 $W_{TCP}$/4 $W_b$/160 $Cl_2$/10 seconds |

Bottom Electrode Temperature = 50° C.
Chamber Temperature = 70° C.

Figure 4:
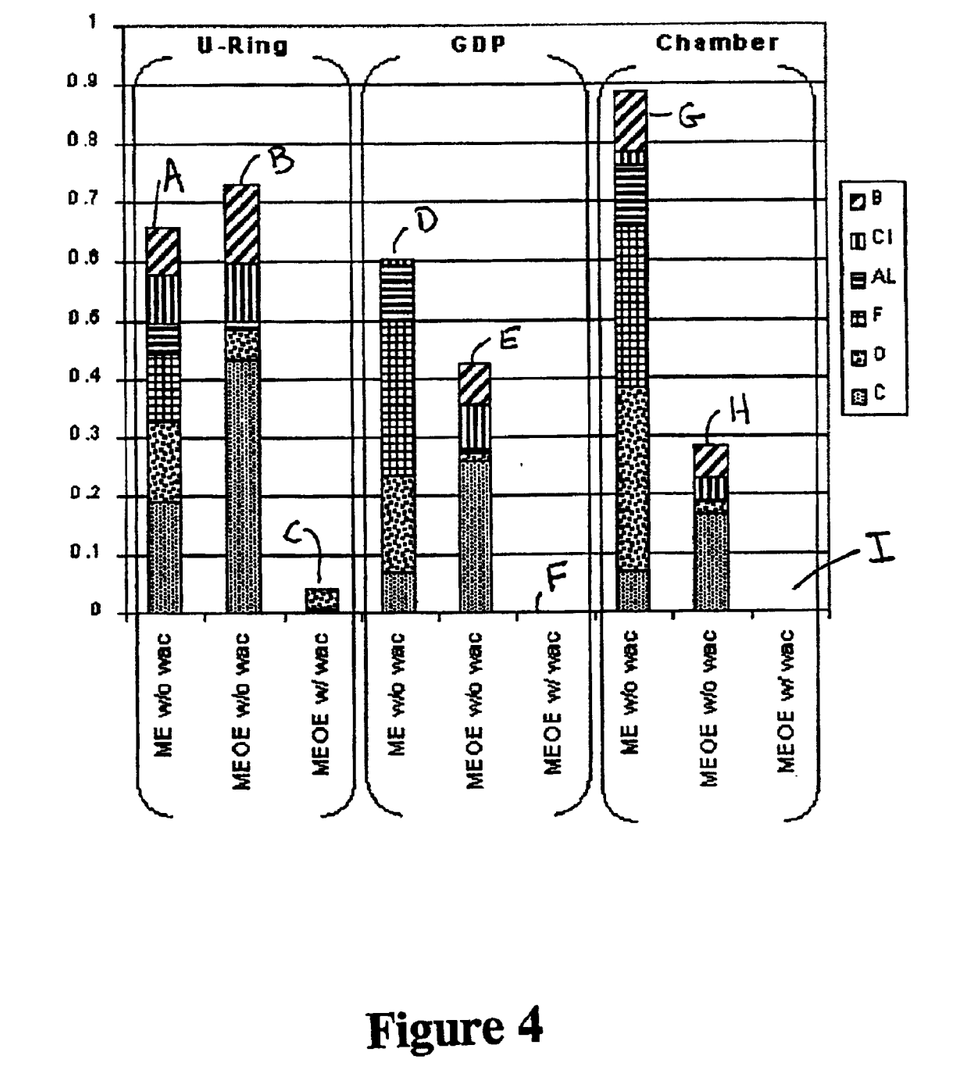
FIG. 4 shows the thickness of the chamber deposits at three sample locations in the chamber under three different combinations of etching and waferless autoclean processes.

FIG. 4 shows that when the base WAC was added after each wafer was processed with ME and OE, almost all of the deposit is eliminated. The amount of Al and F in the chamber deposit is surprisingly decreased with the addition of the $C_xF_yH_z$-free OE step even without WAC. The OE step may eliminate the Al and F in the deposit, leaving mostly volatile substance. This was observed at all three test piece locations and suggests that the ME and OE process is efficient at removing both Al and F deposits and volatile matter.

The mechanism of the OE that results in $AlF_3$ removal may be the plasma chemistry. In a preferred embodiment, the OE chemistry contains $BCl_3$ and $Cl_2$. For example, $BCl_3$ may be reacting with $AlF_3$ to form a volatile product:

$$BCl_3 + AlF_3 \rightarrow BCl_2F + AlF_2Cl \quad (Eq. 1)$$

The exchange of Cl and F might continue to transform $AlF_3$ to volatile $AlCl_3$:

$$BCl_3 + AlF_{3-x}Cl_x \rightarrow BCl_2F + AlF_{2-x}Cl_{x+1}, \text{ where } x=0,1,2 \quad (Eq. 2)$$

It is also possible that the change in the byproducts or etch substrates might contribute to a change in chamber condition that allows $AlF_3$ removal. The byproducts of the wafer changes during the OE since layers such as an oxide layer may undergo etching after the Al is cleared.

In FIG. 4, the coupons at the locations of the U-ring, the GDP and the chamber wall were subjected to three etching conditions, i.e., main etch only (ME w/o WAC), main etch and overetch (MEOE w/o WAC), and main etch, overetch and waferless cleaning (MEOE w/WAC). The process conditions of the ME, OE and WAC are set forth in Table 3.

At the location of the U-ring, column A of FIG. 4 indicates that the deposit thickness was about 0.6 μm after the main etch using 10 sccm $CHF_3$, column B indicates a deposit thickness of about 0.7 μm when the main etch is followed by an overetch using $BCl_3$ and $Cl_2$, and column C indicates that the deposit thickness was reduced to about 0.05 μm after the main etch and overetch are followed by a WAC wherein $O_2$ gas was used as the cleaning gas. Measurements of B, Cl, Si, Al, F, O and C contents of the deposits indicate that about one-third of the deposit after the main etch step was comprised of Al and F, a trace of the deposit after the overetch was comprised of Al and F, and that Al and F were not detected in the remaining deposit after the WAC.

At the location of the GDP, column D of FIG. 4 indicates that the deposit thickness was about 0.6 μm after the main etch using 10 sccm $CHF_3$, column E indicates a deposit thickness of about 0.4 μm when the main etch is followed by an overetch using $BCl_3$ and $Cl_2$, and column F indicates that the deposit was removed after the main etch and overetch are followed by a WAC wherein $O_2$ gas was used as the cleaning gas. Measurements of B, Cl, Si, Al, F, O and C contents of the deposits indicate that about two-thirds of the deposit after the main etch step was comprised of Al and F, and that Al and F were not detected in the remaining deposit after the overetch or after the WAC.

At the location of the chamber wall, column G of FIG. 4 indicates that the deposit thickness was about 0.9 μm after the main etch using 10 sccm $CHF_3$, column H indicates a deposit thickness of about 0.3 μm when the main etch is followed by an overetch using $BCl_3$ and $Cl_2$, and column I indicates that the deposit thickness was removed after the main etch and overetch are followed by a WAC wherein $O_2$ gas was used as the cleaning gas. Measurements of B, Cl, Si, Al, F, O and C contents of the deposits indicate that about one-half of the deposit after the main etch step was comprised of Al and F, and that Al and F were not detected in the remaining deposit after the overetch or after the WAC.

Alternative WAC Chemistry

Different WAC chemistries were examined to better understand the mechanism and to optimize the WAC process. The desired effect of the optimal WAC should eliminate as much of the chamber deposits including $AlF_3$ as possible. Table 4 lists five different WAC recipes used for this evaluation. The wafers used were 50% Open Area Aluminum wafers (10,000 Å Al). 10 sccm $CHF_3$ was chosen for the ME recipe since 10 sccm corresponds to the flow of $CHF_3$ used in conventional Al main etch recipes and 10 sccm of $CHF_3$ contributes Al and F to the chamber deposit, thereby allowing evaluation of the impact of WAC process variations on these deposits.

Figure 5:
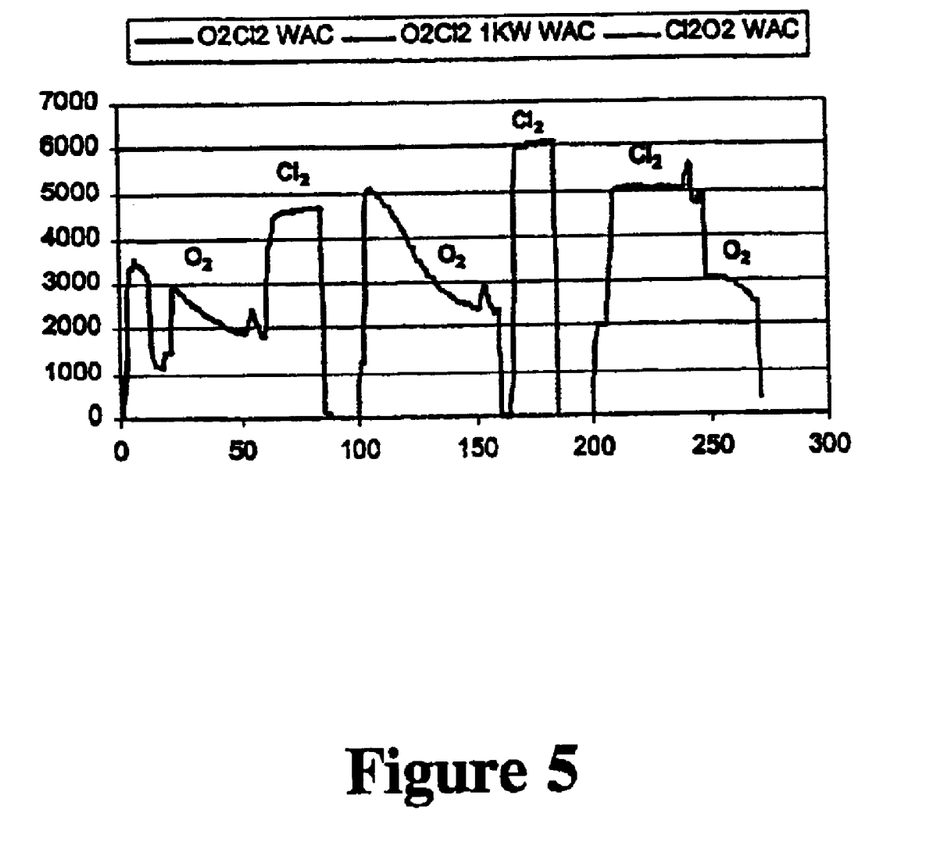
FIG. 5 shows the endpoint trace of three variations of the base waferless autoclean with $CHF_3$ additive metal etch.
Figure 6:
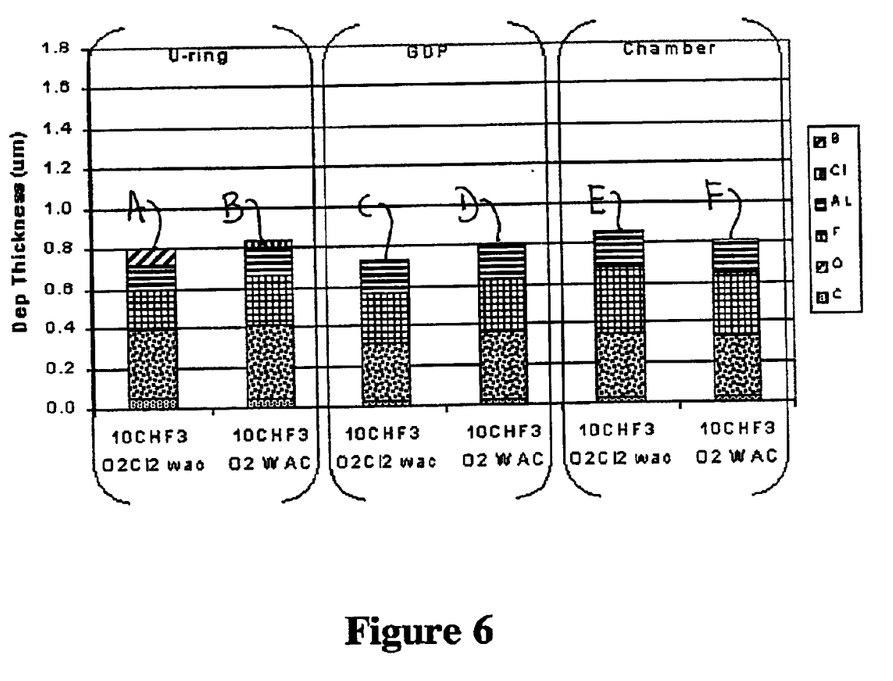
FIG. 6 shows the thickness of the chamber deposits at three sample locations in the chamber when $Cl_2$ is included in an $O_2$ waferless autoclean step.

FIG. 5 depicts the endpoint trace of the three different $O_2/Cl_2$ WAC recipes with 10 sccm $CHF_3$ additive metal etch. FIG. 6 illustrates the deposit thickness of the $O_2/Cl_2$ WAC with 10 sccm $CHF_3$ and an $O_2$ only WAC with 10 sccm $CHF_3$. In the endpoint trace of the base WAC, the $O_2$ part of WAC has a negative slope while the $Cl_2$ part is almost flat suggesting that the $Cl_2$ part of the WAC may not remove any polymer. The thickness data (FIG. 6) illustrates no significant difference between the $O_2/Cl_2$ WAC and the $O_2$ only WAC, further suggesting the small contribution of the $Cl_2$ step to polymer removal. When the gases were reversed from the base WAC recipe, the deposit thickness results exhibit the same trends as for the base WAC and again suggest the limited $Cl_2$ influence on deposits. The results indicate that the $Cl_2$ step may or may not be desirable depending on the effects of the $Cl_2$ step on process shifts such as etch rate, CD, and profile. For example, the $Cl_2$ concentration can influence the $BCl_3$ dissociation thereby providing undissociated $BCl_3$ to the $AlF_3$ reaction as represented in equations 1 and 2.

In FIG. 6, the coupons at the locations of the U-ring, the GDP and the chamber wall were subjected to two etching conditions, i.e., a main etch using 10 sccm $CHF_3$, no overetch, and a WAC with $O_2/Cl_2$ or WAC with only $O_2$.

At the location of the U-ring, column A of FIG. 6 indicates that the deposit thickness was about 0.8 µm when the main etch using 10 sccm $CHF_3$ is followed by a WAC using $O_2$ and $Cl_2$ and column B indicates a deposit thickness of about 0.8 µm when the main etch is followed by a WAC using only $O_2$. Measurements of B, Cl, Si, Al, F, O and C contents of the deposits indicate that about one-half of the deposit was comprised of Al and F after either WAC.

At the location of the GDP, column C of FIG. 6 indicates that the deposit thickness was about 0.7 µm when the main etch using 10 sccm $CHF_3$ is followed by a WAC using $O_2$ and $Cl_2$ and column D indicates a deposit thickness of about 0.8 µm when the main etch is followed by a WAC using only $O_2$. Measurements of B, Cl, Si, Al, F, O and C contents of the deposits indicate that about one-half of the deposit was comprised of Al and F after either WAC.

At the location of the chamber wall, column E of FIG. 6 indicates that the deposit thickness was about 0.8 µm when the main etch using 10 sccm $CHF_3$ is followed by a WAC using $O_2$ and $Cl_2$ and column F indicates a deposit thickness of about 0.8 µm when the main etch is followed by a WAC using only $O_2$. Measurements of B, Cl, Si, Al, F, O and C contents of the deposits indicate that about one-half of the deposit was comprised of Al and F after either WAC.

Figure 7:
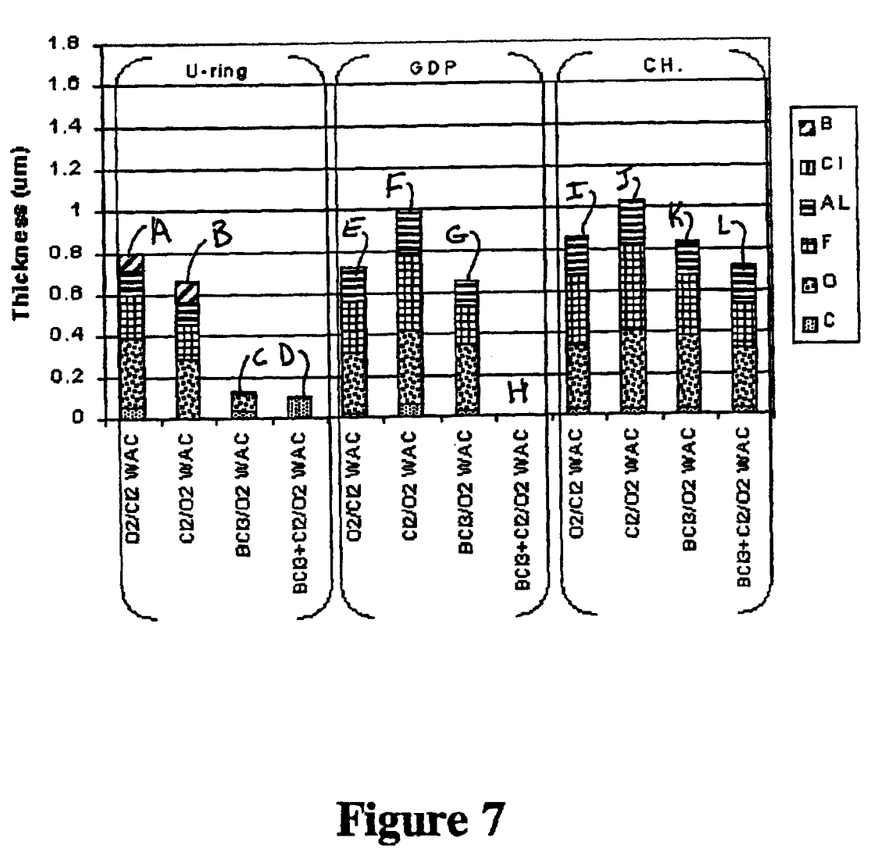
FIG. 7 shows the thickness of the chamber deposits at three sample locations in the chamber under various waferless autoclean recipes.

Different gases such as $Cl_2$ and $BCl_3$ were substituted in the base WAC to find the optimal WAC chemistry that can maximize elimination of chamber polymers along with Al and F. FIG. 7 illustrates deposit thickness at three test locations under four WAC recipes. From FIG. 7, it is observed that the addition of $BCl_3$ in the WAC decreased the deposit thickness on test pieces. At the U-ring, deposit thickness was reduced from >0.6 µm to <0.2 µm and no trace of Al or F was detected in the deposits. This result is consistent with the proposed mechanism for $AlF_3$ removal. The deposition at the GDP was also reduced, but to a lesser extent and the deposit retained detectable levels of Al and F.

In FIG. 7, the coupons at the locations of the U-ring, the GDP and the chamber wall were subjected to four etching conditions set forth in Table 4, i.e., a main etch using 10 sccm $CHF_3$, no overetch, and four different WAC treatments including a base WAC, a $Cl_2/O_2$ WAC, a $BCl_3/O_2$ WAC and a $BCl_3+Cl_2/O_2$ WAC.

At the location of the U-ring, column A of FIG. 7 indicates that the deposit thickness was about 0.8 µm with the base WAC, column B indicates that the deposit thickness was about 0.7 µm with the $Cl_2/O_2$ WAC, column C indicates that the deposit thickness was about 0.1 µm with the $BCl_3/O_2$ WAC, and column D indicates that the deposit thickness was about 0.1 µm with the $BCl_3+Cl_2/O_2$ WAC. Measurements of B, Cl, Si, Al, F, O and C contents of the deposits indicate that about one-half of the deposit was Al+F after the base WAC and $Cl_2/O_2$ WAC whereas Al and F were not detected after the $BCl_3/O_2$ WAC and a $BCl_3+Cl_2/O_2$ WAC.

At the location of the GDP, column E of FIG. 7 indicates that the deposit thickness was about 0.7 µm with the base WAC, column F indicates that the deposit thickness was about 1 µm with the $Cl_2/O_2$ WAC, column G indicates that the deposit thickness was about 0.7 µm with the $BCl_3/O_2$ WAC, and column H indicates that the deposit was removed with the $BCl_3+Cl_2/O_2$ WAC. Measurements of B, Cl, Si, Al, F, O and C contents of the deposits indicate that about one-half of the deposit was Al+F after the base WAC, the $Cl_2/O_2$ WAC and the $BCl_3/O_2$ WAC whereas Al and F were not detected after the $BCl_3+Cl_2/O_2$ WAC.

At the location of the chamber wall, column I of FIG. 7 indicates that the deposit thickness was about 0.9 µm with the base WAC, column J indicates that the deposit thickness was about 1 µm with the $Cl_2/O_2$ WAC, column K indicates that the deposit thickness was about 0.8 µm with the $BCl_3/O_2$ WAC, and column L indicates that the deposit thickness was about 0.7 µm after the $BCl_3+Cl_2/O_2$ WAC. Measurements of B, Cl, Si, Al, F, O and C contents of the deposits indicate that about one-half of the deposit was Al+F after the base WAC, the $Cl_2/O_2$ WAC, the $BCl_3/O_2$ WAC and the $BCl_3+Cl_2/O_2$ WAC.

The $BCl_3+Cl_2/O_2$ WAC was used to mimic the OE recipe, since it was shown above that the OE step followed by $O_2$ WAC eliminated almost all of the deposit. In the tests run to develop the data shown in FIG. 7, the pressure was lowered, $Cl_2$ was added and the etch time of the first step of the WAC was increased to 40 seconds. As shown in FIG. 7, this WAC recipe resulted in the elimination of deposits at the GDP and reduced U-ring deposits to <0.2 µm in thickness. As in the $BCl_3/O_2$ WAC, no trace Al or F was detected in these deposits.

The thickness and composition of the test pieces from the chamber changed little between the different WAC chemistries. This may be caused by the plasma's inability to effectively reach the chamber walls or insufficient WAC time. According to the results of the OE recipe followed by $O_2$ WAC, it is possible to completely eliminate deposits on the test pieces mounted in the chamber. One difference between the conditions of the OE with $O_2$ WAC and the $BCl_3+Cl_2/O_2$ WAC is time. During the OE study, the ME to OE time ratio was almost 1:1 (~43 seconds to 40 seconds) versus 3:2 (60 seconds to 40 seconds) during $BCl_3+Cl_2/O_2$ WAC evaluation. Under sufficiently long time, both the $BCl_3/O_2$ WAC and the $BCl_3+Cl_2/O_2$ WAC should reduce deposit thickness and lower the amounts of Al and F in the deposits.

TABLE 4

Recipes used for alternative WAC chemistry study

| Type of Etch | Etch Recipe | |
|---|---|---|
| Main Etch Recipe | 1) | 12 mT/800 $W_{TCP}$/130 $W_b$/120 $Cl_2$/70 $BCl_3$/10 $CHF_3$/60 seconds |
| Base WAC Recipe ($O_2/Cl_2$ WAC) | 1) | 30 mT/800 $W_{TCP}$/100 $W_b$/200 $O_2$/3 seconds |
| | 2) | 30 mT/800 $W_{TCP}$/4 $W_b$/200 $O_2$/12 seconds |
| | 3) | 30 mT/800 $W_{TCP}$/4 $W_b$/160 $Cl_2$/10 seconds |
| $Cl_2/O_2$ WAC Recipe | 1) | 30 mT/800 $W_{TCP}$/100 $W_b$/200 $O_2$/3 seconds |
| | 2) | 30 mT/800 $W_{TCP}$/4 $W_b$/160 $Cl_2$/12 seconds |
| | 3) | 30 mT/800 $W_{TCP}$/4 $W_b$/200 $O_2$/10 seconds |
| $BCl_3/O_2$ WAC Recipe | 1) | 30 mT/800 $W_{TCP}$/100 $W_b$/100 $Cl_2$/3 seconds |
| | 2) | 30 mT/800 $W_{TCP}$/4 $W_b$/100 $BCl_3$/12 seconds |
| | 3) | 0 mT/0 $W_{TCP}$/0 $W_b$/5 seconds |
| | 4) | 30 mT/800 $W_{TCP}$/100 $W_b$/200 $O_2$/3 seconds |
| | 5) | 30 mT/800 $W_{TCP}$/4 $W_b$/200 $O_2$/10 seconds |
| $BCl_3 + Cl_2/O_2$ WAC Recipe | 1) | 12 mT/800 $W_{TCP}$/100 $W_b$/100 $Cl_2$/3 seconds |
| | 2) | 12 mT/800 $W_{TCP}$/4 $W_b$/50 $BCl_3$/50 $Cl_2$/40 seconds |
| | 3) | 0 mT/0 $W_{TCP}$/0 $W_b$/5 seconds |
| | 4) | 30 mT/800 $W_{TCP}$/100 $W_b$/200 $O_2$/3 seconds |
| | 5) | 30 mT/800 $W_{TCP}$/4 $W_b$/200 $O_2$/12 seconds |

Bottom Electrode Temperature = 50° C.
Chamber Temperature = 70° C.

While the invention has been described in detail with reference to specific embodiments thereof, it will be apparent to those skilled in the art that various changes and modifications can be made, and equivalents employed, without departing from the scope of the appended claims.

What is claimed is:

1. A method of removing aluminum fluoride deposits from a plasma etch reactor, comprising the steps of:
    plasma etching an aluminum layer on a semiconductor wafer in a plasma etch reactor, the plasma etching resulting in aluminum fluoride deposits in the plasma etch reactor;
    supplying a cleaning gas to the plasma etch reactor, the cleaning gas comprising at least $BCl_3$; and
    cleaning the aluminum fluoride deposits from the plasma etch reactor by energizing the cleaning gas into a plasma state such that the $BCl_3$ gas is dissociated and undissociated $BCl_3$ reacts with aluminum fluoride deposits in the plasma etch reactor.

2. The method of claim 1, wherein the cleaning gas includes $Cl_2$, the $Cl_2$ being supplied to the plasma etch reactor at a rate sufficient to obtain a desired degree of dissociation of the $BCl_3$.

3. The method of claim 1, wherein the plasma etching step includes a main etch using at least $C_xF_yH_z$ as the main etching gas wherein x≧1, y≧1, and z≧0 and a $C_xF_yH_z$-free overetch using $BCl_3$ and optionally $Cl_2$ as the overetching gas.

4. The method of claim 3, further comprising removing the semiconductor wafer from the plasma etch reactor prior to supplying the cleaning gas to the plasma etch reactor.

5. The method of claim 3, wherein the main etching gas comprises $C_xF_yH_z$ wherein x≧1, y≧1, and z≧0, $Cl_2$, $N_2$ and $BCl_3$.

6. The method of claim 3, wherein $C_xF_yH_z$ comprises $CF_4$, $CHF_3$ or mixture thereof.

7. The method of claim 1, further comprising a step of conditioning the plasma etch chamber after the cleaning step.

8. The method of claim 1, wherein the plasma etch reactor comprises an ECR plasma reactor, an inductively coupled plasma reactor, a capacitively coupled plasma reactor, a helicon plasma reactor or a magnetron plasma reactor.

9. The method of claim 1, wherein pressure in the plasma etch reactor is 5 to 40 mTorr, 40 to 200 mTorr or 200 to 1000 mTorr.

10. The method of claim 1, wherein the plasma etch reactor is an inductively coupled plasma reactor having an antenna which inductively couples radio frequency energy into an interior of the plasma etch reactor through a dielectric member, the plasma etch reactor including a bottom electrode on which the semiconductor substrate can be supported, the antenna being powered with 100 to 3000 watts during the cleaning step and the bottom electrode being powered with 0 to 3000 watts during the cleaning step.

11. A method of reducing aluminum fluoride deposits formed in a plasma etch reactor during processing of a semiconductor substrate, comprising steps of:
    supporting a semiconductor substrate in a plasma etch reactor;
    supplying an etching gas to the plasma etch reactor;
    etching a layer on the semiconductor substrate during a main etch by energizing the etching gas into a plasma state, the etching gas used during the main etch including $C_xF_yH_z$ wherein x≧1, y≧1, z≧0, the main etch resulting in buildup of aluminum fluoride deposits on interior chamber surfaces exposed to the plasma within the plasma etch reactor, and
    etching the layer on the semiconductor substrate during an overetch etch by energizing the etching gas into a plasma state, the etching gas used during the overetch including $BCl_3$ which is at least partially dissociated in the plasma, the undissociated $BCl_3$ reducing the buildup of aluminum fluoride deposits on the interior chamber surfaces.

12. The method of claim 11, wherein the etching gas used during the overetch is $C_xF_yH_z$-free and includes $Cl_2$ in an amount relative to the $BCl_3$ to provide a desired degree of dissociation of the $BCl_3$.

13. The method of claim 11, wherein the layer comprises an aluminum layer covered with a patterned photoresist, the main etch forming a pattern of conductor lines in the aluminum layer.

14. The method of claim 11, wherein the etching gas includes $Cl_2$ and/or $BCl_3$ during the main etch.

15. The method of claim 11, further comprising removing the semiconductor substrate from the plasma etch reactor and cleaning the interior chamber surfaces by energizing a cleaning gas into a plasma state.

16. The method of claim 15, wherein the cleaning gas includes $O_2$, $Cl_2/O_2$, $BCl_3/O_2$, or $BCl_2+Cl_2/O_2$.

17. The method of claim 15, wherein the etching gas during the main etch includes at least $CHF_3$ and the cleaning gas includes $BCl_3$ and $Cl_2$, the $Cl_2$ being added in an amount relative to the $BCl_3$ to provide a desired degree of dissociation of the $BCl_3$.

18. The method of claim 11, wherein the etching gas is supplied into the plasma etch reactor through a gas distribution plate (GDP) and the semiconductor substrate is a silicon wafer supported on a substrate support having a uniformity ring around an outer periphery of the wafer, the interior chamber surfaces including the gas distribution plate, the uniformity ring and a chamber wall surrounding the substrate support, the overetch step reducing buildup of aluminum fluoride deposits on the GDP, the uniformity ring and/or the chamber wall.

19. The method of claim 11, wherein the semiconductor substrate comprises a silicon wafer having a layer of aluminum thereon, the etching gas during the main etch comprising $CHF_3$ supplied to the plasma etch reactor at a flow rate of less than 10 sccm.

20. The method ad of claim 11, wherein the plasma etch reactor comprises an inductively coupled plasma reactor having an antenna which couples 100 to 3000 watts of RF power into an interior of the plasma etch reactor through a dielectric member, the plasma etch reactor including a bottom electrode on which the semiconductor substrate is supported, the bottom electrode being supplied 0 to 3000 watts RF power during the main etch and overetch steps.

* * * * *